(12) United States Patent
Kim et al.

(10) Patent No.: US 6,417,603 B1
(45) Date of Patent: Jul. 9, 2002

(54) PIEZOELECTRIC TRANSFORMER WITH PATTERNS FOR RECOGNIZING NODE POINT

(75) Inventors: Jong-Sun Kim; Nak-Cheol Sung, both of Suwon (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/011,316

(22) Filed: Dec. 11, 2001

(30) Foreign Application Priority Data

Nov. 22, 2001 (KR) ............................. 2001-72997

(51) Int. Cl.[7] .................... H01L 41/04; H01L 41/08; H01L 41/18; H02N 2/00
(52) U.S. Cl. .................. 310/365; 310/359; 310/363; 310/364; 310/366
(58) Field of Search ................. 310/359, 363, 310/364, 365, 366

(56) References Cited

U.S. PATENT DOCUMENTS

| | | | | |
|---|---|---|---|---|
| 2,988,728 A | * | 6/1961 | Marlow | 29/25.35 |
| 4,633,204 A | * | 12/1986 | Gounji et al. | 310/359 |
| 5,032,755 A | * | 7/1991 | Witte | 310/312 |
| 5,847,491 A | | 12/1998 | Taihaku et al. | 310/355 |
| 5,894,185 A | * | 4/1999 | Asada et al. | 310/368 |
| 6,043,588 A | * | 3/2000 | Tabota et al. | 310/328 |
| 6,078,127 A | * | 6/2000 | Saito et al. | 310/359 |
| 6,140,747 A | * | 10/2000 | Saito et al. | 310/328 |
| 6,333,589 B1 | * | 12/2001 | Inoi et al. | 310/351 |

* cited by examiner

*Primary Examiner*—Tran Nguyen
*Assistant Examiner*—Peter Medley
(74) *Attorney, Agent, or Firm*—Lowe Hauptman Gilman & Berner, LLP

(57) ABSTRACT

Disclosed is a piezoelectric transformer provided with node point recognition patterns for visually indicating respective node points, at which external electrical connection of input and output electrodes is made, thereby allowing the external electrical connection of the input and output electrodes to be easily achieved in a manual wire soldering process, while allowing the wire soldering process to be automatically carried out irrespective of the size of the piezoelectric transformer. The piezoelectric transformer, which includes a piezoelectric member, an input electrode, an output electrode, and a ground electrode, the electrodes being printed on the piezoelectric member, further includes a plurality of node point recognition patterns extending radially about the center of each of the electrodes while being spaced apart from the center of the electrode by a desired radial distance. Each node point recognition pattern is formed by removing a portion of the electrode corresponding to the node point recognition pattern.

6 Claims, 5 Drawing Sheets

PIEZOELECTRIC TRANSFORMER WITH PATTERNS FOR RECOGNIZING NODE POINT

BACKGROUND OF THE INVENTION

1. Field of the Invention

The present invention relates to a piezoelectric transformer adapted as a high-voltage DC generating device, and more particularly to a piezoelectric transformer provided with node point recognition patterns for visually indicating respective node points, at which external electrical connection of input and output electrodes is made, thereby allowing the external electrical connection of the input and output electrodes to be easily achieved.

2. Description of the Related Art

Recently, piezoelectric transformers, which are adapted as high-voltage DC generating devices, have been used at an increased rate, as compared to coil transformers, because they have features of reduced size, high efficiency, high electrical insulation, and nonflammable, as compared to those coil transformers.

Piezoelectric transformers are mainly used in inverters for back light adapted to turn on and off color liquid crystal displays of notebooks, PDA (Personal Digital Assistant), DVC (Digital Video Camera), DSC (Digital Still Camera) and the like, and in high-voltage power supply devices equipped static brushes, air cleaners, and ozone generators.

Such a piezoelectric transformer basically consists of a piezoelectric member, an input electrode attached to the piezoelectric member and adapted to apply voltage of a certain level to the piezoelectric member, and an output electrode for outputting a voltage of a desired level from the piezoelectric member. When AC voltage having a frequency corresponding to the intrinsic vibration frequency of the piezoelectric member is applied to the piezoelectric member via the input electrode, the piezoelectric member vibrates mechanically. The mechanical vibration energy of the piezoelectric member is transformed into electrical energy, and then outputted via the output electrode. Thus, the piezoelectric transformer boosts the input voltage using piezoelectric vibrations.

FIG. 1 illustrates a general Rosen type piezoelectric transformer. As shown in FIG. 1, the Rosen type piezoelectric transformer, which is denoted by the reference numeral 10, includes a piezoelectric member 11 having two opposite rectangular major surfaces, that is, first and second surfaces, and four side surfaces, that is, third through sixth surfaces, connecting the first and second surfaces. The piezoelectric transformer 10 also includes an input electrode 12 formed on a first one of two equal surface portions longitudinally divided on the first surface of the piezoelectric member 11, an output electrode 13 formed on the third surface of the piezoelectric member 11 not contacting the input electrode 12, and a ground electrode 14 formed on a first one of two equal surface portions longitudinally divided on the second surface of the piezoelectric member 11 while being arranged opposite to the input electrode 12. That is, the piezoelectric member 11 is longitudinally divided into two portions, that is, a first portion provided with the input electrode 12 and ground electrode 13, and a second portion provided with the output electrode 13

When AC voltage of a certain level from an AC power source S is applied between the input electrode 12 and the ground electrode 14 in the above mentioned conventional Rosen type piezoelectric transformer, mechanical vibrations are generated in vertical directions at the first portion of the piezoelectric member 11 in accordance with the electrical energy of the applied voltage. By virtue of the vibrations, the second portion of the piezoelectric member 11 vibrates in longitudinal directions. The longitudinal vibrations are transformed into electrical energy which is, in turn, outputted via the output electrode 13. Such a piezoelectric effect provided in accordance with the application of AC voltage serves to generate a boosting effect.

The waveform diagram shown in the lower portion of FIG. 1 illustrates the waveform of vibrations generated at the Rosen type piezoelectric transformer 10. The first portion of the piezoelectric member 11 formed with the input electrode serves as a driving section (or an input section) for transforming electrical energy into mechanical vibration energy, whereas the second portion of the piezoelectric member 11 formed with the output electrode 13 serves as an electrical output generating section (or outputting section) for transforming vibration energy into electrical energy.

FIG. 2 illustrates an improved Rosen type piezoelectric transformer which has an output electrode structure improved over the above mentioned Rosen type piezoelectric transformer, in order to achieve easy external electrical connection of electrodes. As shown in FIG. 2, this piezoelectric transformer, which is denoted by the reference numeral 20, includes a rectangular piezoelectric member 21 having the same structure as the piezoelectric member 11 of the conventional Rosen type piezoelectric transformer 10. Similarly to the conventional Rosen type piezoelectric transformer 10, the piezoelectric transformer 20 also includes an input electrode 22 formed on the first portion of the first surface of the piezoelectric member 21, an output electrode 23 formed on the second surface portion of the first surface of the piezoelectric member 21 at the end of the second surface portion spaced away from the input electrode 22, and ground electrodes 24 and 25 respectively formed on the second surface of the piezoelectric member 21 while being vertically symmetrical with the input and output electrodes 22 and 23.

In order to implement an inverter or a high-voltage power supply device using the above mentioned piezoelectric transformer of FIG. 1 or 2, it is necessary to conduct a wire soldering process for the input, output, and ground electrodes of the piezoelectric transformer in order to achieve external electrical connection of those electrodes.

In the wire soldering process, a wire is soldered at a node point corresponding to the center of an associated electrode. Where wire is soldered at a portion of the electrode other than the node point, dispersion of characteristics may occur, thereby causing non-uniform vibration. As a result, the product exhibits a degraded reliability.

Furthermore, where the soldering positions on the upper and lower surfaces of the input section of the piezoelectric transformer are misaligned from each other, the piezoelectric transformer exhibits an increase in characteristic dispersion and a degradation in characteristics. In particular, where piezoelectric transformers are mass-produced, there is a problem involved with productivity. Where it is desired to conduct an automatic wire soldering process, it is necessary to install automatic equipment, in which the position of each node point is set for a particular size of piezoelectric transformers. For this reason, there is a problem in that it is necessary to modify the equipment to cope with a change of the size of piezoelectric transformers to be produced.

SUMMARY OF THE INVENTION

Therefore, the present invention has been made in view of the above mentioned problems involved with the related art, and an object of the invention is to provide a piezoelectric transformer provided with node point recognition patterns for visually indicating respective node points, at which external electrical connection of input and output electrodes is made, thereby allowing the external electrical connection of the input and output electrodes to be easily achieved in a manual wire soldering process, while allowing the wire soldering process to be automatically carried out irrespective of the size of the piezoelectric transformer.

In order to accomplish this object, the present invention provides A piezoelectric transformer comprising a piezoelectric member, an input electrode, an output electrode, and a ground electrode, the electrodes being printed on the piezoelectric member, further comprising: a plurality of node point recognition patterns extending radially about the center of each of the input, output, and ground electrodes while being spaced apart from the center of the electrode by a desired radial distance, each of the node point recognition patterns being formed by removing a portion of the electrode corresponding to the node point recognition pattern.

The node point recognition patterns may comprise two line patterns extending radially about the center of the electrode while being radially aligned with each other, respectively.

Alternatively, the node point recognition patterns may comprise four line patterns extending radially about the center of the electrode while forming a cross, respectively.

Each of the node point recognition patterns preferably has a line width of 100 to 150 $\mu$m, and/or a length 0.5 to 3 mm in order to prevent a degradation in piezoelectric characteristics.

The center of the electrode surrounded by the node point recognition patterns corresponds to a node point, at which a wire is soldered.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, the piezoelectric transformer according to the present invention will be described with reference to the annexed drawings.

Figure 1:
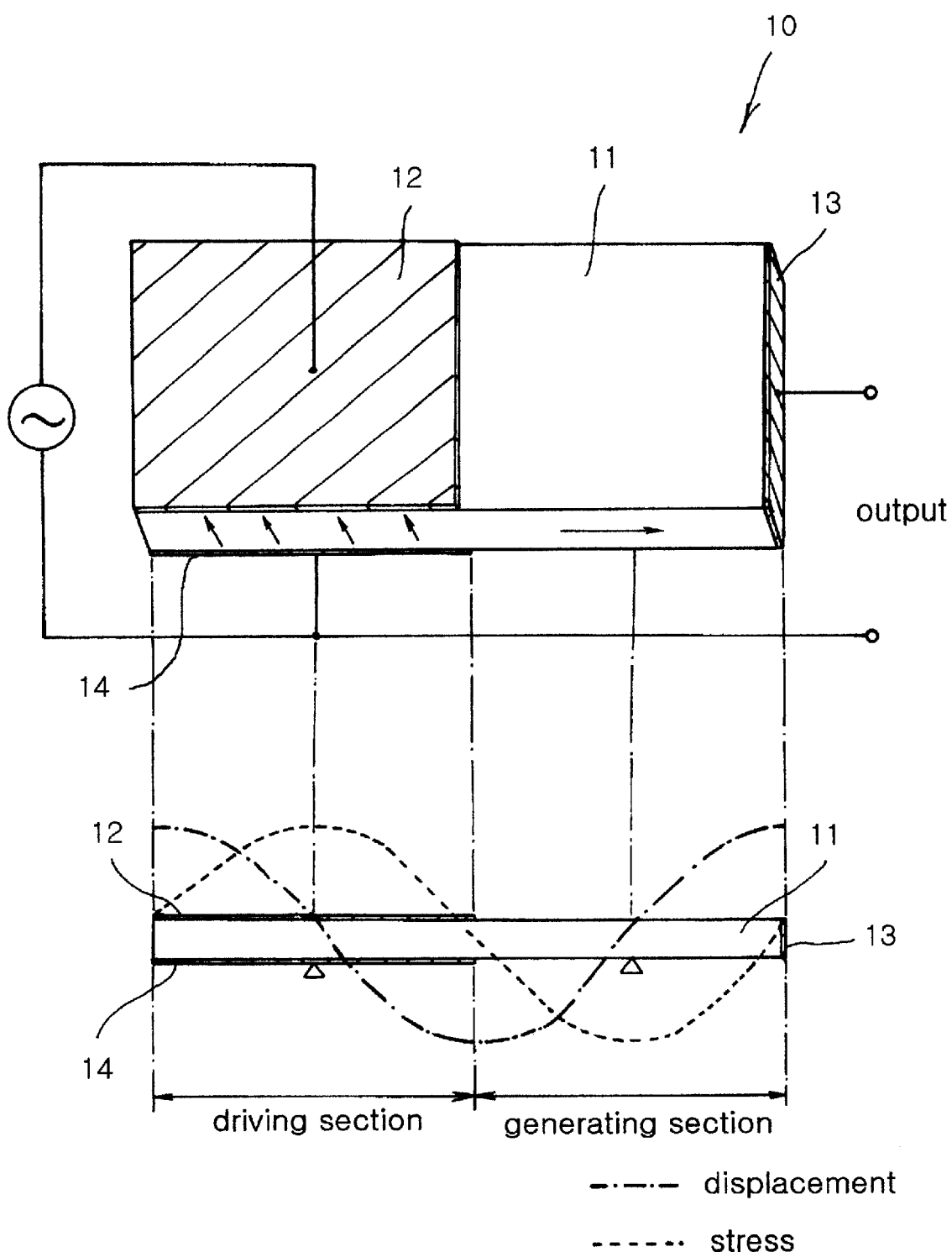
FIG. 1 is a perspective view illustrating the basic configuration of a conventional piezoelectric transformer, along with a waveform diagram showing the waveform of vibrations generated at the piezoelectric transformer.
Figure 2:
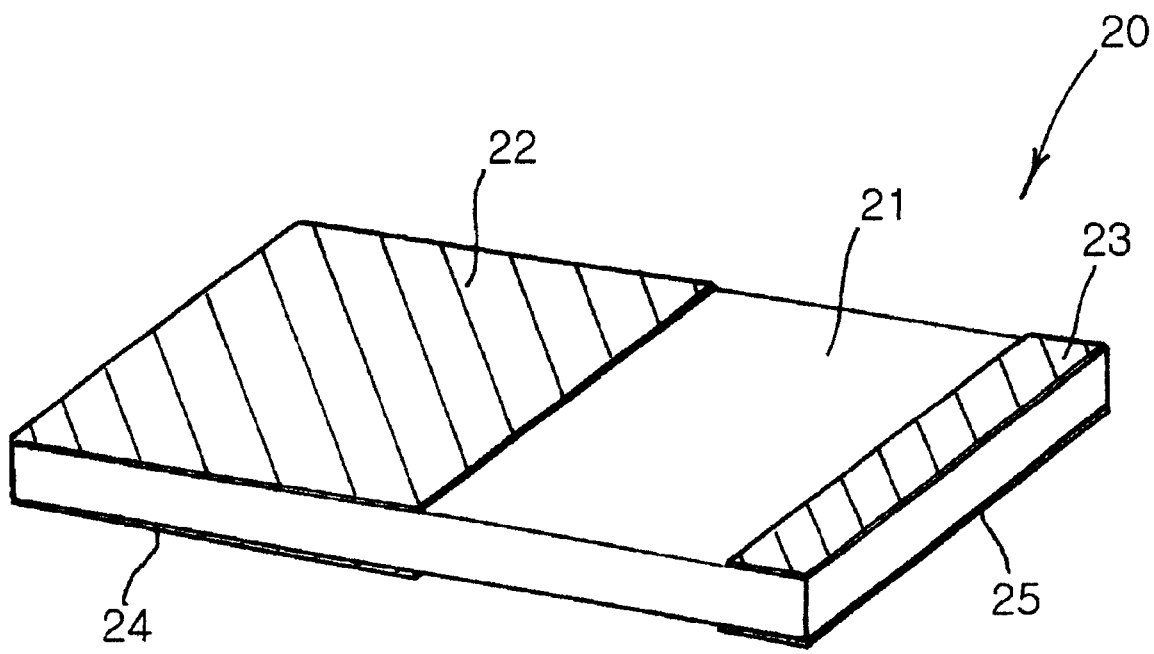
FIG. 2 is a perspective view illustrating another conventional piezoelectric transformer.
Figure 3:
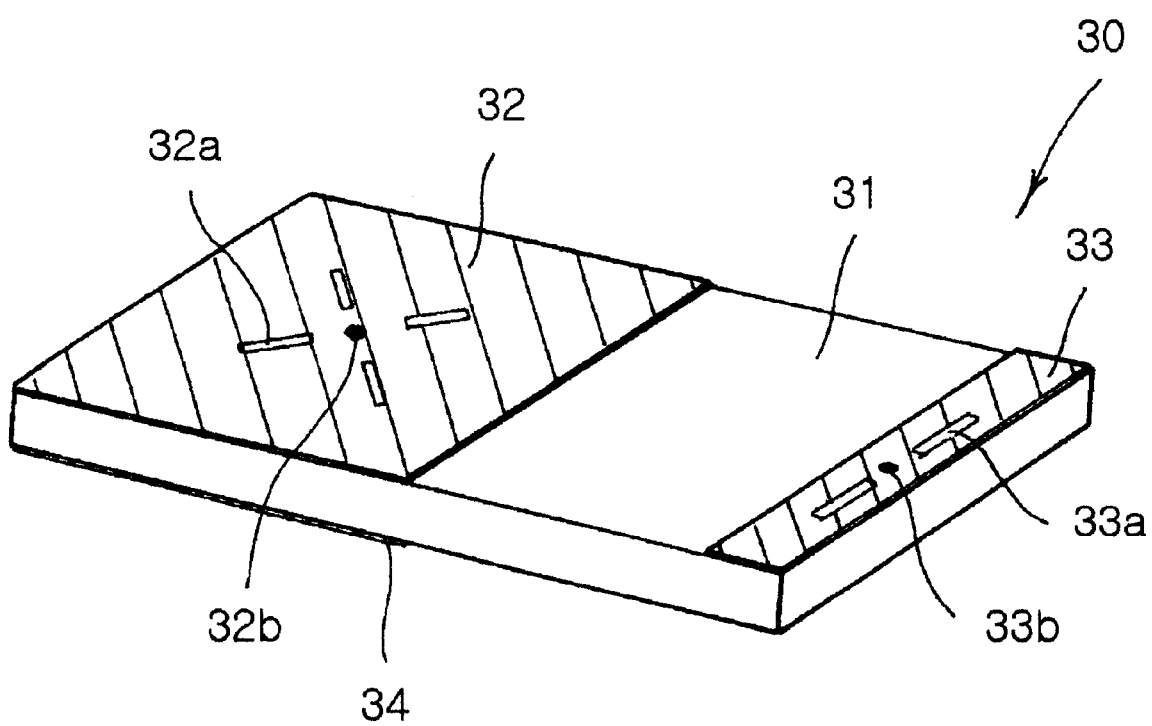
FIG. 3 is a perspective view illustrating a piezoelectric transformer according to an embodiment of the present invention.
Figure 4:
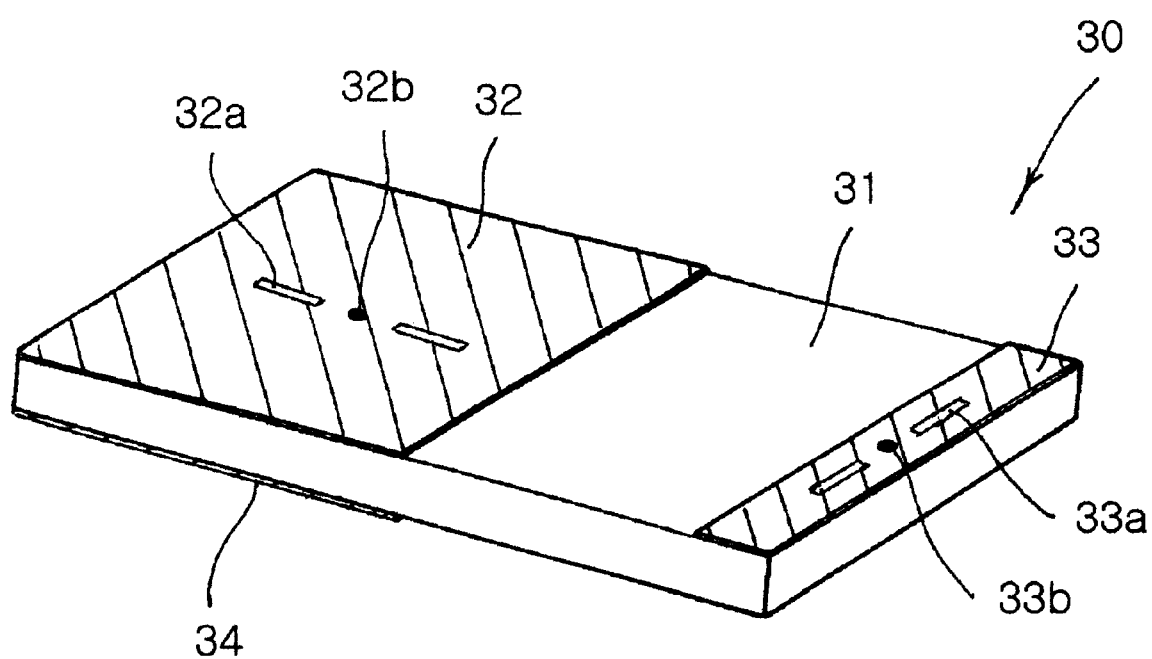
FIG. 4 is a perspective view illustrating a piezoelectric transformer according to another embodiment of the present invention.
Figure 5:
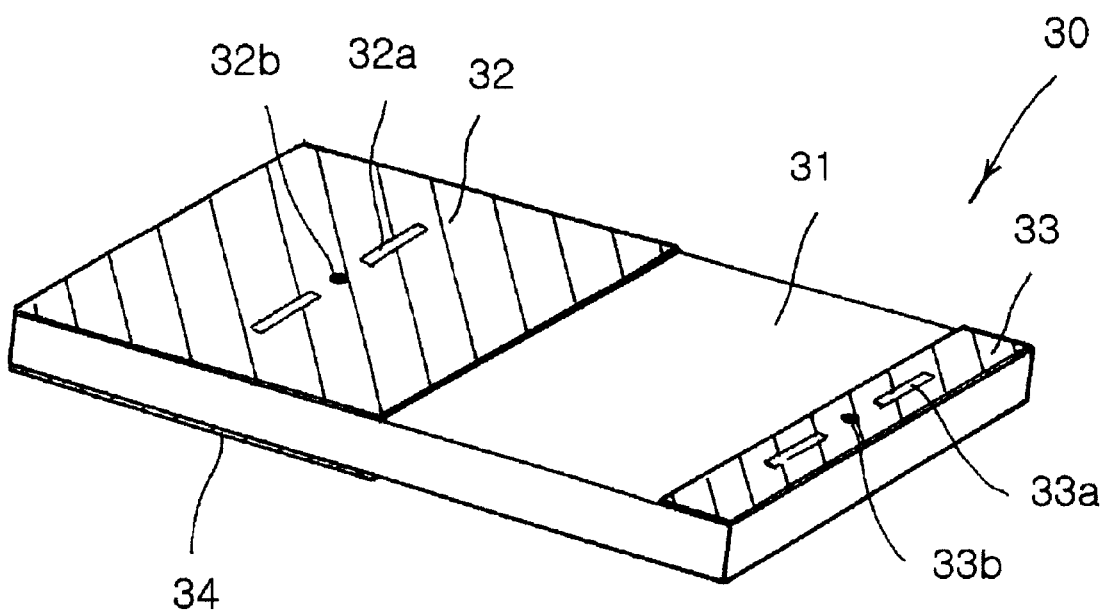
FIG. 5 is a perspective view illustrating a piezoelectric transformer according to another embodiment of the present invention.

FIGS. 3 to 5 are perspective views respectively illustrating a piezoelectric transformer which has various structures according to embodiments of the present invention.

Basically, the piezoelectric transformer, which is denoted by the reference numeral 30 in FIGS. 3 to 5, includes a rectangular parallelepiped piezoelectric member 31 having two opposite rectangular major surfaces, that is, first and second surfaces, and four side surfaces, that is, third through sixth surfaces, connecting the first and second surfaces. The piezoelectric transformer 30 also includes an input electrode 12 formed on a first one of two equal surface portions longitudinally divided on the first surface of the piezoelectric member 31, that is, a left or right surface portion. An output electrode 33 is formed on the second surface portion of the first surface of the piezoelectric member 31 at the end of the second portion spaced away from the input electrode 32. The piezoelectric transformer 30 further includes a ground electrode 34 formed on the second surface of the piezoelectric member 31 while being vertically symmetrical with the input electrode 32, and node pattern recognition patterns 32a and 33a respectively formed at the input and output electrodes 32 and 33 in the form of crossed lines or straight lines extending toward the center of the input or output electrode 32 or 33 associated therewith without being connected to each other. Each of the node recognition patterns 32a and 33a is formed by removing the portion of the associated electrode corresponding to that recognition pattern. Although not shown in the drawings, the ground electrode 34 has node pattern recognition patterns identical or similar to those of the input electrode 32.

In the case of the piezoelectric transformer shown in FIG. 3, the recognition patterns 32a on the input electrode 32 have the form of four straight lines extending radially about the center of the input electrode 32 to form a cross without being connected to each other. In this case, the recognition patterns 33a on the output electrode 33 have the form of two straight lines extending radially about the center of the output electrode 33 while being aligned with each other in a longitudinal direction of the output electrode 33 without being connected to each other. Although not shown in FIG. 3, the ground electrode 34 has node pattern recognition patterns identical or similar to the recognition patterns 32a of the input electrode 32.

In the case of the piezoelectric transformer shown in FIG. 4, the recognition patterns 32a on the input electrode 32 have the form of two straight lines extending radially about the center of the output electrode 33 while being laterally aligned with each other. As mentioned above, these recognition patterns 32a are formed by removing the portion of the associated electrode corresponding to that recognition pattern. In this case, the output electrode 33 is formed with node point recognition patterns 33a having the same form as those of FIG. 3.

The piezoelectric transformer of FIG. 5 is substantially similar to the piezoelectric transformer of FIG. 4, except that the recognition patterns 32a on the input electrode 32 have the form of two straight lines extending radially about the center of the output electrode 33 while being vertically aligned with each other, as compared to the case of FIG. 4, in which the straight lines are laterally aligned with each other.

The node point recognition patterns formed at the input, output, and ground electrodes 32, 33, and 34 in each embodiment of the present invention have a width and a length causing no variation in the characteristics of the piezoelectric transformer. Preferably, each node point recognition pattern has a line width of 100 to 150 $\mu$m, and a length of 0.5 to 3 mm. These line width range and length range correspond to a resolution range allowing a worker to visually identify the recognition patterns in the manufacture of the piezoelectric transformer. Where the recognition patterns have an excessively small line width or length, it is impossible to obtain a desired resolution in a patterning process for forming those recognition patterns. On the other hand, where the recognition patterns have an excessively large size, that is, the electrode area removed for the formation of the recognition patterns is excessively large, a degradation in piezoelectric characteristics may occur. Accordingly, it is preferred that the node point recognition patterns have the above defined size.

In accordance with the present invention, the node point recognition patterns to be formed at each electrode are formed by removing, in the form of radially extending straight lines, portions of the electrode arranged around the center of the electrode where a node point is to be positioned, while leaving the central portion of the electrode. Thus, the node point can be easily visually recognized by the recognition patterns. Accordingly, the external electrical connection of the electrode can be easily and accurately made by conducting a desired wire soldering process at the central portion of the electrode indicated by the recognition patterns.

In accordance with the present invention, the formation of the node point recognition patterns on each electrode can be made by simply modifying the screen-printing electrode pattern used for the electrode without any addition of processing steps. That is, the recognition patterns can be formed on the electrode by coating an electrode material such as Ag on the piezoelectric member 31, except for the portions of the piezoelectric member 31 respectively corresponding to those recognition patterns, upon printing the electrode.

By virtue of the node point recognition patterns formed on each electrode of the piezoelectric transformer as described above, it is possible to accurately and easily recognize the node point, at which a wire is to be soldered for the external electrical connection of the electrode. Accordingly, the wire soldering process can be accurately carried out at a desired position. Since the node point can be easily recognized based on the recognition patterns arranged around the node point, it is possible to automatically carry out the wire soldering process.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. For example, although the present invention has been described in conjunction with embodiments associated with Rosen type piezoelectric transformers, it is applicable to any types of piezoelectric transformers.

As apparent from the above description, the present invention provides a piezoelectric transformer provided with node point recognition patterns for visually indicating a node point to be used as a soldering point in a wire soldering process for an external electrical connection of the electrode upon constructing a desired circuit or device using the piezoelectric transformer, thereby allowing the wire soldering process to be easily and accurately achieved. By virtue of the node point recognition patterns, an easily node point recognition can be achieved even when the piezoelectric transformer has a changed size. Accordingly, there is an advantage in that the wire soldering process can be automatically carried out.

What is claimed is:

1. A piezoelectric transformer comprising a piezoelectric member, an input electrode, an output electrode, and a ground electrode, the electrodes being printed on the piezoelectric member, further comprising:

a plurality of node point recognition patterns extending radially about the center of each of the input, output, and ground electrodes while being spaced apart from the center of the electrode by a desired radial distance, each of the node point recognition patterns being formed by removing a portion of the electrode corresponding to the node point recognition pattern.

2. The piezoelectric transformer according to claim 1, wherein the node point recognition patterns comprise two line patterns extending radially about the center of the electrode while being radially aligned with each other, respectively.

3. The piezoelectric transformer according to claim 1, wherein the node point recognition patterns comprise four line patterns extending radially about the center of the electrode while forming a cross, respectively.

4. The piezoelectric transformer according to claim 1, wherein each of the node point recognition patterns has a line width of 100 to 150 µm.

5. The piezoelectric transformer according to claim 1, wherein each of the node point recognition patterns has a length 0.5 to 3 mm.

6. The piezoelectric transformer according to claim 1, wherein the center of the electrode surrounded by the node point recognition patterns corresponds to a node point, at which a wire is soldered.

* * * * *